United States Patent [19]

Takagi

[11] Patent Number: 5,445,676
[45] Date of Patent: Aug. 29, 1995

[54] METHOD AND APPARATUS FOR MANUFACTURING SEMICONDUCTOR DEVICES

[75] Inventor: Mikio Takagi, Kanagawa, Japan

[73] Assignee: F.T.L. Co., Ltd., Kanagawa, Japan

[21] Appl. No.: 321,745

[22] Filed: Oct. 12, 1994

Related U.S. Application Data

[62] Division of Ser. No. 964,609, Oct. 22, 1992, Pat. No. 5,387,557.

[30] Foreign Application Priority Data

Oct. 23, 1991 [JP] Japan .................. 3-302718
Feb. 2, 1992 [JP] Japan .................. 4-069319
Sep. 7, 1992 [JP] Japan .................. 4-264183

[51] Int. Cl.$^6$ .................... C23C 16/00
[52] U.S. Cl. .................... 118/719; 118/725; 118/729
[58] Field of Search .................... 118/719, 725, 729

[56] References Cited

U.S. PATENT DOCUMENTS

| | | |
|---|---|---|
| 3,602,192 | 8/1971 | Grochowski . |
| 4,857,689 | 8/1989 | Lee . |
| 4,950,870 | 8/1990 | Mitsuhashi et al. . |
| 4,962,063 | 10/1990 | Maydan et al. ............ 437/228 |
| 4,962,965 | 10/1990 | Brown et al. ............ 437/742 |
| 4,979,464 | 12/1990 | Kunze-Concewitz ......... 118/719 |
| 5,029,554 | 7/1991 | Miyashita et al. ......... 118/715 |
| 5,043,300 | 8/1991 | Nulman ............ 437/200 |
| 5,058,526 | 10/1991 | Matsushita et al. ......... 118/715 |
| 5,116,784 | 5/1992 | Ushikawa ............ 437/225 |
| 5,178,639 | 1/1993 | Nishi ............ 29/25.02 |

FOREIGN PATENT DOCUMENTS

2023384 11/1970 Germany .
60-67672 4/1985 Japan .
63-278227 11/1988 Japan .

OTHER PUBLICATIONS

J. Appl. Phys., vol. 63, No. 8, 15 Apr. 1988, R60, R99–104.
Roozeboom et al., J. Vac. Sci. Technol. B8 (6), Nov./Dec. 1990, pp. 1249–1258.

Primary Examiner—Richard Bueker
Attorney, Agent, or Firm—Armstrong, Westerman, Hattori, McLeland & Naughton

[57] ABSTRACT

A wafer(s) for producing semiconductor devices is subjected to heat treatment in a vertical thermal reactor, which is provided with an electric heating means setting a first temperature and another electric heating means setting a second temperature higher than the first temperature. The wafer(s) is moved upwards and is subjected to a treatment in the second region of the vertical thermal reactor; and, is reverted to the first region. Rapid thermal processing of 6 or 8 inch wafer(s) is possible without causing slip lines.

22 Claims, 9 Drawing Sheets

METHOD AND APPARATUS FOR MANUFACTURING SEMICONDUCTOR DEVICES

This is a division of application Ser. No. 07/964,609, filed Oct. 22, 1992 now U.S. Pat. No. 5,387,557.

BACKGROUND OF INVENTION

1. Field of Invention

This invention is related to a method and apparatus for manufacturing semiconductor devices including Si devices, GaAs devices and TFT (thin film transistor). More particularly, the present invention relates to a technique which enables, by use of an electric vertical furnace, rapid thermal treatment. More specifically the present invention is related to ah eating technique using a heating apparatus having simultaneous different temperature in the different sections along the axis of the electric vertical furnace and shortening the intermediate region between the high and low temperature regions by making the temperature gradient between these regions steep.

2. Description of Related Arts

In accordance with the development of semiconductor devices in recent years various heat-treatment techniques have been developed. These include such heat treatments as oxidation, diffusion, annealing, CVD and the like in the case of manufacturing ultra LSIs.

A vertical or horizontal hot-wall type electric furnace has been used for heat-treatments as described above. Meanwhile, along with larger scale integration and fine patterning of semiconductor devices, it is necessary to form a shallow junction and to suppress the re-distribution of impurities. In order to decrease the sum of total heat mass of the Si devices, rapid thermal treatment has been employed.

The first described method using a hot-wall type electric furnace enables a batch treatment and has excellent temperature stability but involves difficulty in temperature-control. The second described method using a lamp-annealing furnace has advantages that a plurality of wafers can be treated, and, further the process-temperature can be controlled. This is therefore allegedly one of the most attractive methods in recent use.

Regarding 64M DRAMs, the pattern rule for manufacturing semiconductor devices is 0.35 μm rule. In the manufacturing of such devices, a CVD oxide layer is formed as n inter-layer insulating beneath a B-PSG layer and the B-PSC layer is subjected to reflowing to flatten its surface. Total quantity of heat imparted to semiconductor devices is important for manufacturing 64-M-DRAMs.

Specifically, in the case of transistor produced by a conventional process, the sources and drains formed by the ion-implantation undergo a shape change when heat is imparted thereto at 850° C. for 70 minutes or longer, so that characteristics of the transistors are impaired. Furthermore, monosilane could be used in the growth of CVD oxide film in the case of 16M-DRAM, whose pattern rule is 0.6-0.4 μm, but could no more be used for 64M-DRAMs because a CVD oxide film is formed at 800°-850° C., if retained for 60-120 minutes.

In the manufacturing of 64M-DRAMs, a process frequently used comprises covering a polysilicon layer with a CVD oxide layer and forming a continuous B-PSG layer to be used as a flattening layer. The CVD oxide layer, which covers the polysilicon layer, prevents boron or phosphorous in the B-PSG layer from diffusing into the polysilicon layer, Thickness of the CVD-oxide layer required to attain this diffusion-preventing function is from 500 to 1000 angstroms.

When an aluminum conductor layer is to be formed on the B-PSG layer, it is necessary to form a CVD oxide layer on the B-PSG layer after its reflowing.

As is described hereinabove, a rapid thermal annealing method is appropriate for manufacturing semiconductor devices having a shallow junction. However, the lamp annealing method does not yet attain a temperature distribution on the wafer surface as uniform as that attained by an electric furnace. Therefore, when a wafer is subjected to the rapid thermal annealing method, thermal stress is caused under the temperature distribution provided by such a method and hence slip lines generate from the peripheral part of the wafer.

Allegedly, the rapid thermal annealing method experimentally achieved success in the heat treatment of 6 inch wafers. However, even in experiments, the slip lines are inevitably formed on the wafers, when the scale of experiments is enlarged such that the number of wafers treated is comparable to that of mass production. In order to avoid the slip lines in mass production, the temperature elevating speed in a lamp-annealing furnace must be lowered to a significantly low level.

Rapid-thermal processing of an 8-inch wafer, which must be used for the 16M or more DRAMs, is more difficult than that for 6-inch wafer. The rapid-thermal processing of an 8-inch wager is hence not applied to an industrial production. A report is made in J. Vac. Sci, Technol. B. 8(6), Nov./Dec. 1990, pp 1249-1259 (American Vacuum Society) that the rapid-heating annealing is tried by using a hot-wall type electric furnace including a silicon-carbide reaction tube. However, in the furnace reported in this journal a mere annealing is carried out.

It is known that a high-temperature region and a low-temperature region are formed in a horizontal furnace, in which a number of wafers are subjected to diffusion sequentially in the above order. A number of wafers are carried on wafer holders successively connected with one another and are conveyed from one end to the other end of the furnace during diffusion. This diffusion method is in principle inappropriate for the formation of a CVD layer and rapid thermal annealing.

SUMMARY OF THE INVENTION

It is therefore an object of the present invention to provide a method for manufacturing a semiconductor device, which method can apply a rapid thermal annealing to a large wafer with a diameter of 8 inches, and which realizes a clean process which is adaptable to various production processes of semiconductor devices.

It is another object of the present invention to provide an apparatus for manufacturing semiconductor devices, which apparatus can be applied to a rapid-heating annealing of a large wafer with a diameter of 8 inches or more, and which realizes a clean process which is adaptable to various production processes of semiconductor devices.

It is a further object of the present invention to provide a method and apparatus for manufacturing semiconductor devices, which can fulfill the objects described above and which can reduce particles generated during heat-treatment in the furnace.

In accordance with the objects of the present invention, there is provided a method for manufacturing semiconductor devices (hereinafter referred to as "the first method") comprising the steps of:

introducing a wafer(s) into a vertical thermal reactor from its lower end;

heating by an electric heating means a first region of the vertical thermal reactor, said first region extending over a predetermined distance;

subjecting the wafer(s) to a first treatment in said first region of the vertical thermal reactor at a first temperature;

heating by another electric means a second region of the vertical thermal reactor, said second region situated above the region, extending over a predetermined distance and having a second temperature higher than the first temperature;

moving the wafer(s) upwards from the first region to a second region;

subjecting the wafer(s) to a second treatment in the second region of the vertical thermal reactor; and, reverting the wafer(s) to the first region.

It is preferred in the methods of the present invention to adjust a staying time of the wafer(s) in the first region, which wafer(s) is reverted to the first region, for a duration which is at least so long not to cause slip liens on the wafer(s).

In accordance with the objects of the invention, there is also provided an embodiment of the first method (hereinafter referred to as "the first embodiment"), wherein the first treatment is a chemical vapor deposition (CVD) and the second treatment is a rapid thermal annealing.

According to a second embodiment of the first method, the first treatment is the formation of a thin layer, and the second treatment is a reflowing treatment of the thin film.

According to a third embodiment of the first method, the first treatment is the formation of a thin layer, and the second treatment is a reflowing treatment of the thin layer and then the formation of another layer on the reflown thin layer.

According to another embodiment of the first method, a wafer(s) can be subjected to three treatments. The manufacturing method according to this embodiment further comprises a step of heating by another electric heating means a third region of the vertical thermal reactor, said third region being situated between said first and second regions, extending over a predetermined distance and having a third temperature higher the first temperature and lower than the second temperature, and a step of subjecting the wafer or wafers in the third treatment in the third region.

According to another embodiment of the first method, a wafer(s) can be subjected to four treatments. The manufacturing method according to this embodiment further comprises a step of heating by another electric heating means a fourth region of the vertical thermal reactor, said fourth region being situated between said first and third regions, extending over a predetermined distance and having a fourth temperature higher than the first temperature and lower than the fourth temperature, and a step of subjecting the wafer or wafers in the fourth treatment in the fourth region.

In accordance with the objects of the present invention, there is also provided a method for manufacturing semiconductor devices (hereinafter referred to as "the second method") comprising the steps of:

introducing a wafer(s) into a vertical thermal reactor from its lower end;

heating by a first electric heating means a first region of the vertical thermal reactor, said first region extending over a predetermined distance;

subjecting the wafer(s) to a first treatment temperature in said first region of the vertical thermal reactor;

heating by a second electric means a second region of the vertical thermal reactor, said second region being situated above the first region, extending over a predetermined distance and having a second temperature higher than the first temperature;

moving the wafer(s) upwards from the first region to a second region through an intermediate region between the first and second regions, which intermediate region separating the first and second electric heating means from one another;

setting a temperature gradient in the intermediate region;

subjecting the wafer(s) to a second treatment in the second region of the vertical thermal reactor;

reverting the wafer(s) from the second region to the first region; and, withdrawing reaction gas of the first treatment in the vertical reduction tube from a port provided in the intermediate region or in at least one of the first and second regions in the vicinity of the intermediate region.

According to an embodiment of the second method (hereinafter referred to as "the fourth embodiment"), the first treatment is CVD ad the second treatment is the rapid thermal annealing or reflowing of the CVD film. The CVD treatment may be the formation of B-PSG (boron phosphosilicate glass) or the formation of $SiO_2$. $SiO_2$ can be formed by using $SiH_4$ and $N_2O$ at a temperature of from 830° C. to 850° C. The growth rate of $SiO_2$ is approximately 20 Å/minute. $SiO_2$ can also be formed by TEOS tetraethoxy silane at a temperature of for example 650° C. The growth rate of $SiO_2$ is from approximately 30 to 200 Å/minute. The reaction gas of the first treatment essentially does not invade into the second region and hence does not contaminate the wall of reaction tube in this region.

In accordance with the objects of the present invention, there is provided an apparatus for manufacturing semiconductor devices (hereinafter referred to as "the first apparatus") for processing one or more semiconductor wafers therein comprising:

a ring-like reactor body having a cylindrical outer surface portion, said outer portion extending vertically, said reactor body having an open bottom end portion and closed top portion;

a first electric heating means for establishing a first region of the vertical thermal reactor, said first region extending over a predetermined distance;

a second electric heating means for establishing a second region of the vertical thermal reactor, said second region situated above the first region, extending over a predetermined distance and having a second temperature higher than the first temperature;

a means for moving the wafer or wafers from the first to second regions and then from the second to first regions and holding the wafer or wafers in these regions for any processing; and, a gas inlet for introducing reaction gas into said inner space of the body.

In accordance with the objects of the present invention, there is also provided an apparatus for manufacturing semiconductor devices (hereafter referred to as "the second apparatus") for processing one or more semiconductor wafers therein comprising;

a reactor body having a cylindrical outer surface portion, said outer portion extending vertically, said reactor body having an open bottom end portion and closed top portion;

a first electric heating means for establishing a first region of the vertical thermal reactor, said first region extending over a predetermined distance;

a second electric heating means for establishing a second region of the vertical thermal reactor, said second region situated above the first region, extending over a predetermined distance and having a second temperature higher than the first temperature;

an intermediate region between the first and second regions, for separating the first and second electrical heating means from one another, which region having an adjustable length;

a port for withdrawing gas in the reactor body, formed through the body in the intermediate region or in the vicinity of at least one of the first and second regions;

a means for moving the wafer or wafers from the first to second regions and then from the second to first regions and holding the wafer or wafers in these regions for any processing; and, a gas-inlet for introducing reaction gas into said inner space of the body.

In the methods and apparatuses according to the present invention, an electric vertical furnace is utilized, since it exhibits good thermal stability and realizes a rapid heating annealing. These methods and apparatuses can be adapted to various processes of semiconductor wafers. The two regions are used for example in the case of typical CVD such that the first region having a relatively low temperature provides a reaction chamber where a thin layer is formed, and, further, the second region having a relatively high temperature provides a high-temperature region where annealing or another layer is formed. Typically, one wafer is introduced from the lower end of the apparatus and is subjected to the growth of a thin layer in the relatively low temperature region. The apparatuses of the present invention may be provided with three or more regions, upper regions having higher temperature than the lower regions.

In accordance with the objects of the present invention, there is provided a method for manufacturing semiconductor devices (hereinafter referred to as "the third method") comprising steps of;

introducing a wafer(s) into a vertical thermal reactor from its lower end;

heating by an electric heating means a first region of the vertical thermal reactor, said first region extending over a predetermined distance;

subjecting the wafer(s) to a first treatment in said first region of the vertical thermal reactor at a first temperature;

heating by another electric means a second region of the vertical thermal reactor, said second region being situated above the first region, extending over a predetermined distance and having a second temperature higher than the first temperature;

moving the wafer(s) upwards from the first region to the second region;

subjecting the wafer(s) to a second treatment in the second region of the vertical thermal reactor;

reverting the wafer(s) from the second region to the first region; and, during said moving and reverting of the wafer(s), passing said wafer(s) through an intermediate region between said first and second regions, provided with a means for shielding and absorbing heat from both first and second electric heating means and establishing a temperature-gradient in the passing direction of the wafer(s).

Although the methods according to the present invention are described with reference to heating of the wafer(s) used for manufacturing semiconductor device(s), the method according to the present invention can also be applied to heating any materials, articles or products other than the wafer(s).

In accordance with the objects of the present invention, there is provided an apparatus for manufacturing semiconductor devices (hereinafter referred to as "the third apparatus") for processing one or more semiconductor wafers therein comprising;

a vertical reactor body having a cylindrical outer surface portion, said outer portion extending vertically, said reactor body having an open bottom end portion and closed top portion;

a first electric heating means for establishing a first region of the vertical thermal reactor, said first region extending over a predetermined distance;

a second electric heating means for establishing a second region of the vertical thermal reactor, said second region situated above the first region, extending over a predetermined distance and having a second temperature higher than the first temperature;

a means for moving the wafer or wafers from the first to second regions and then from the second to first regions and holding the wafer or wafers in these regions for any processing; and, an intermediate region of the vertical reactor body between the first and second regions, provided with a means for shielding and absorbing heat from both first and second electric heating means.

The present invention, the heat-absorbing means may be provided on both ends with a heat-reflecting plate coated with a heat-refracting film.

According to the present invention, the wafer subjected to the treatment in the second region is then reverted to the first region. The wafer may be held in the first region for any process or to adjust the temperature descending rate. The wafer may not be held in the first region but may be moved continuously through this region. Reverting of the wafer to the first region is important for avoiding an abrupt temperature fall which may result in the formation of slip lines.

The growth of a thin coating layer at a relatively low temperature may take place at a furnace temperature of approximately 700° C. Such growths are silicon dioxide from organic silane or disilane, or B-PSG layer from tetraethoxy silane (TEOS), tetramethoxy phosphorous (TMOP), tetramethoxy boron (TMOB) or tetramethoxy silicate boron (TMSB).

The annealing or growth of a thin layer at high temperature comprises a heat treatment at approximately 850° C. It is for example the relfowing of the already formed layer or a conventional CVD for forming silicon dioxide using monosilane.

Another feature provided by using two electric heating means for establishing the high temperature and low-temperature spaces in the vertical reactor resides in that: the temperature gradient realized between these spaces is gentle, so that a wafer can be quickly displaced into the high-temperature regions by means of elevating; a short-time process can be carried out in the high-temperature region; then, the wafer can be reverted to the low-temperature region immediately after the high-temperature process. As a result, a rapid thermal annealing can be carried out subsequent to the formation of the thin layer, which is one of the best embodiments of the present invention. The whole process as described above is clean. Thermal stability of an electric furnace has been actually verified by a vertical furnace. Rapid heating annealing of a large sized wafer with a diameter of 8 inches or more can be advantageously carried out without causing slip lines.

As is described hereinabove, basically one wafer should be treated at one time. However, two or more wafers can be simultaneously treated, provided that they do not undergo heat history different from one another. A holding means for holding the wafers may not be specific but may be made of conventional quartz. The wafer holder is preferably rotated by a rotatable axis so as to ensure uniform temperature distribution on the wafer surface, as is carried out in a conventional vertical furnace.

According to specific embodiments of the present invention, the following CVD methods can be carried out.

|   | Low temperature First region | High temperature Second region | Low temperature First region |
|---|---|---|---|
| A. | Growth of B-PSG | Reflowing | — |
| B. | Growth of silicon dioxide | Growth of B-PSG | |
| C. | Growth of silicon dioxide Growth of B-PSG | Reflowing | — |
| D. | Growth of B-PSG | Reflowing | Growth of silicon dioxide |
| E. | Growth of silicon dioxide | Growth of B-PSG Reflowing | |
| F. | Growth of silicon dioxide | Growth of B-PSG Reflowing | Growth of silicon dioxide |
| G. | Sintering of Sputtered Ti to convert it to TiSi$_2$ | RTP under N$_2$ atmosphere, or conversion of TiSi$_2$ by NH$_3$ to TiN | |

An item C CVD for forming silicon dioxide and then growth of a B PSG are consecutively carried out in the low-temperature region. In Item E, growth of a B-PSG and reflowing are carried out simultaneously in the high-temperature region.

The reflowing mentioned in Items C through F can be carried out under condition of 850° C. for 70 minutes (Condition 1). Under Condition 2 with temperature higher than Condition 1 by 50° C. (900° C.) the same diffusion depth of sources and drain under Condition 1 is provided at a time one fifth as short as Condition 1, i.e., 14 minutes (840 seconds). The above mentioned reflow can be carried out at 900° C. for 100 seconds (Condition 3). The quantity of heat imparted under Condition 3 is one eighth as low as Condition 2. Condition 3 is applicable to the production of 256M-DRAM, to which the 0.25 μm pattern rule is applied.

Typically, a substrate, which has already been subjected to surface insulation, depositing a polysilicon, and its delineating, is subjected to formation of CVD as described above. However, the CVD methods as described above can be carried out at any step during the processing of wafers. In the first and second methods and apparatuses, inflow of gas from the first and second regions to each other is prevented by means of withdrawing the gas at or in the vicinity of the intermediate region. The withdrawal of reactant gas can prevent formation of particles in said other region. Preferably in the first and second methods and apparatuses, reactant gas or inert gas, such as nitrogen gas, is flown from both ends of the reaction tube and meet at the intermediate region. The confluent gases are withdrawn from the intermediate region or its vicinity. When various gases are caused to flow into the reaction tube, preferably, a reactant gas is flown into a region, where a wafer is positioned for forming a layer, and, the inert gas such as nitrogen gas is flown into a region, where no wafer is positioned. The inlet gas can prevent inflow of the reactant gas into either the first or second region where no wafer is positioned, and hence prevent contamination of or particle formation in such region. Therefore, reactant gas flown from one of the first and second regions does not invade into the other region and neither contaminates the other region nor forms particles in the other region.

A wafer is preferably held or moved in a reaction tube in such a manner that the wafer is positioned vertical to direction of introduction into the reaction tube. A wafer may however be positioned slightly aslant of the direction of introduction. When the degree of rapid movement of wafers is low, they may be held or moved in a reaction tube in such a manner that the wafers are positioned parallel to the direction of introduction into the reaction tube. This parallel positioning enhances the treating efficiency.

The present invention is hereinafter described with reference to the drawings.

DESCRIPTION OF THE PREFERRED EMBODIMENTS

Figure 1:
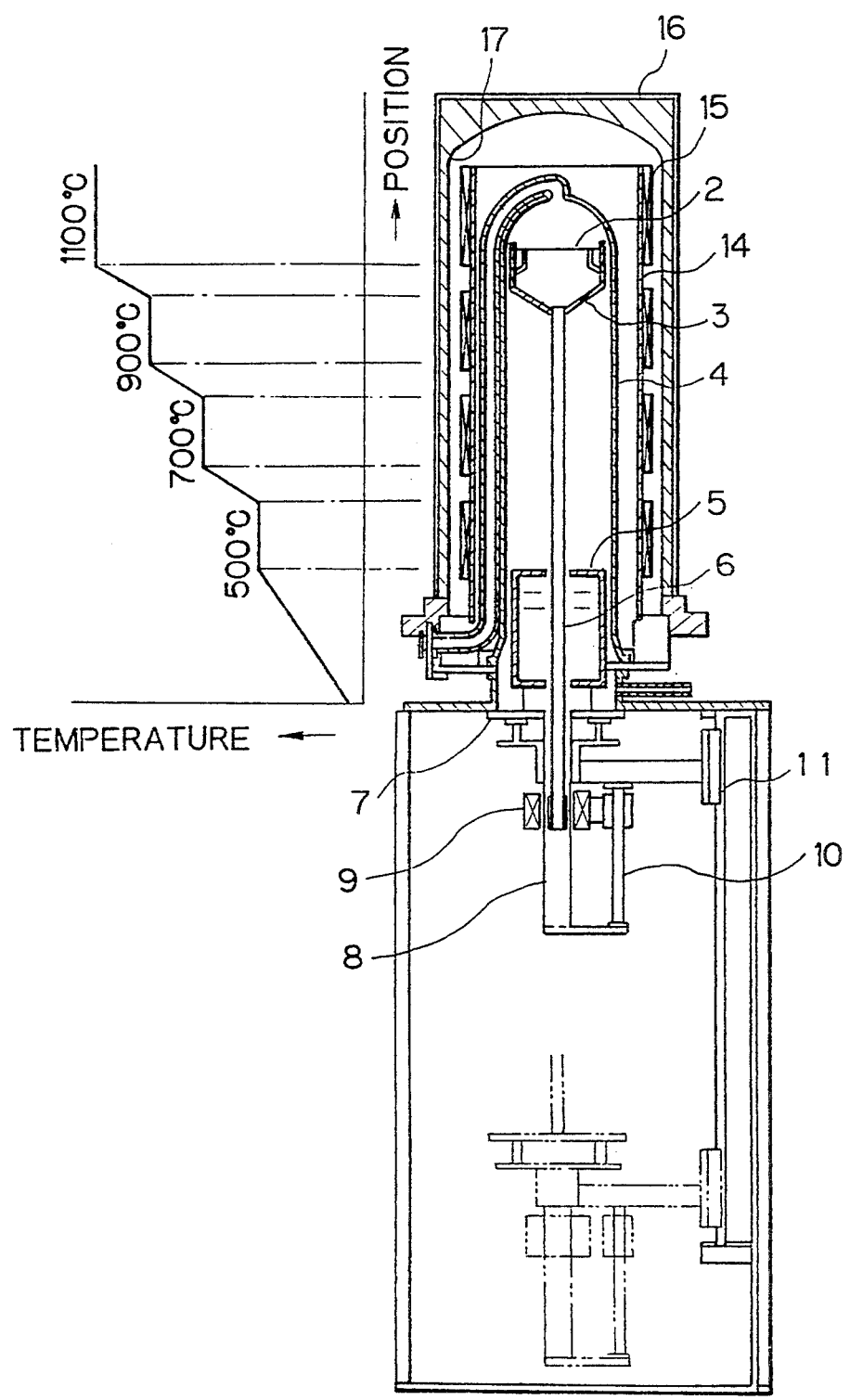
FIG. 1 illustrates an embodiment of the first apparatus according to the present invention and temperature distribution in this apparatus.

Referring to FIG. 1, the heating means 15 comprising electric heaters are attached to surround an outer surface of a vertical quartz tube 4. The heating means 15 comprise four separate electric heaters. Although four separate heaters are shown in the drawing, one integral heater may be used, provided that it generates different temperatures. The vertical quartz tube 4 has an inlet at the top of the tube and gas is introduced from the inlet. The gas-introduction system is the one disclosed in U.S. patent application Ser. No. 07/611,386, the present inventor being one of the inventors of this application. The vertical quartz tube 4 abuts upon a susceptor 7 having a gas outlet. Basically a single wafer is mounted on the wafer holder 2 and the wafer holder 2 is set on a moving rod 6 which in turn is operably connected to a wafer-moving system comprising an outer tube 8, magnets 9, driving mechanism 10 and elevating mechanism 11 of the wafer holder. These components 7-10 are lowered as shown by the two-dot lines when the wafer is to be withdrawn from the vertical quartz tube 4.

A heat-insulation tube is denoted by 5. A quartz tube for mounting the electric heaters is denoted by 14. The electric heaters 15 and the vertical quartz tube 4 are surrounded by the reflector 17.

In a vertical reactor, reactant gas for CVD is generally introduced and withdrawn upwards, while gas used in diffusion, oxidation or heat treatment is generally introduced and withdrawn downwards. No matter which one of the directions of gas introduction and withdrawal is used, the electric heaters 15 are so designed that the temperature distribution rises successively in the vertical upward direction. When the heat mass of the whole processing apparatus is relatively small, and the electric heaters 15 are arranged with a space therebetween, stepwise temperature distribution is provided. An example of the stepwise temperature-distribution is shown in FIG. 1, that is, regions, in which temperature of 500° C., 700° C., 900° C. and 1100° C. are maintained, are formed. Each region establishes a heating space, where the temperature in a wafer is stabilized. The temperature difference between the adjacent regions is determined depending upon the temperature elevating speed and the maximum temperature.

When high heat-elevating speed and high maximum temperature are desired, the step is made great, that is, the difference in temperature between the adjacent regions is made greater.

Figure 2:
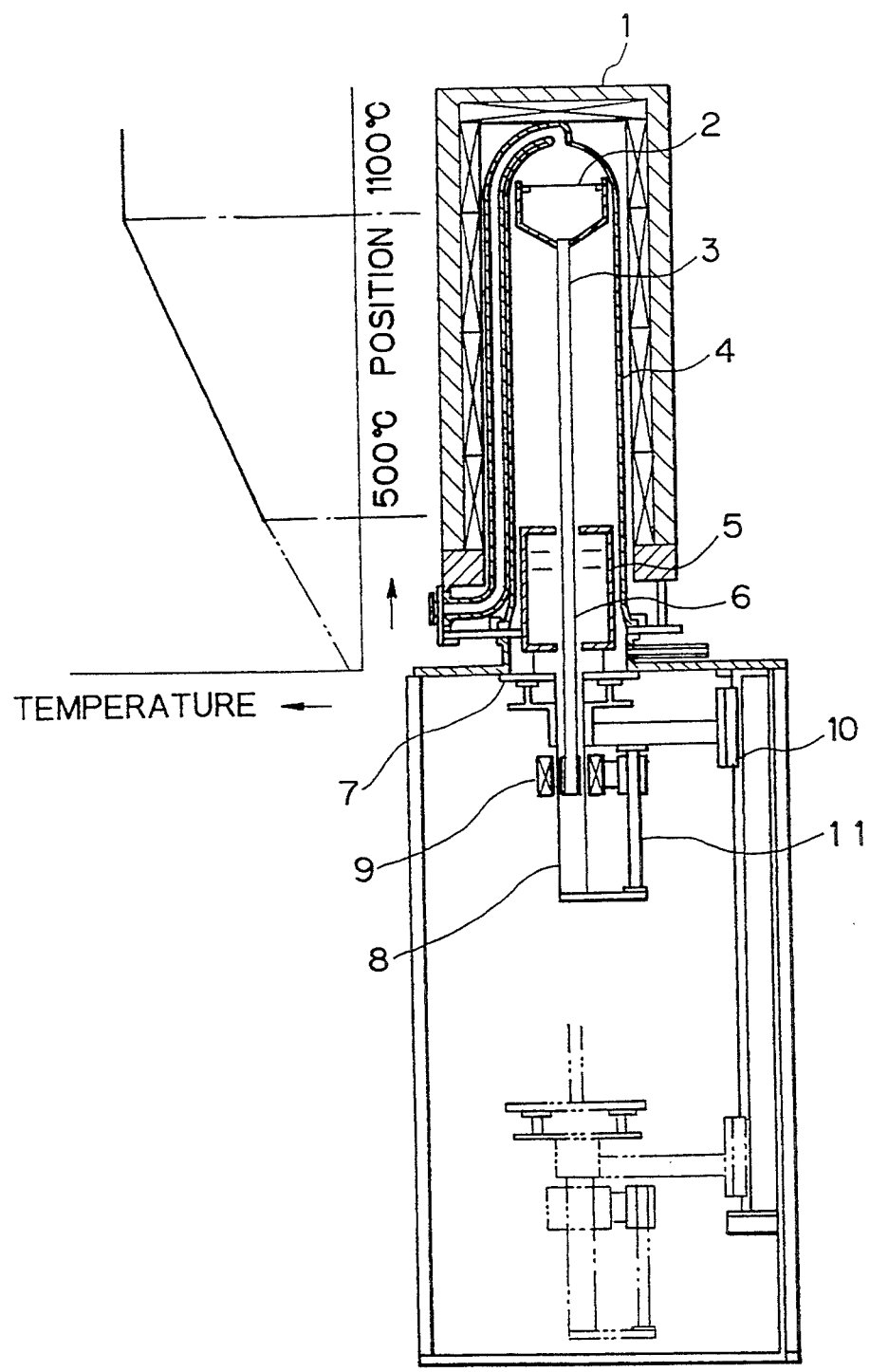
FIG. 2 illustrates another embodiment of the first apparatus according to the present invention and temperature distribution in this apparatus.

When the heat mass of the whole processing apparatus is relatively great, rapid heating of a wafer does not influence the temperature distribution in a processing reactor. In addition, although the electric heaters are spaced between one another, no stepwise temperature-distribution is formed between the electric heaters. Therefore in the case of a relatively great heat mass, the regions where the temperature is constant, are only two, e.g. at 500° C. and 1100° C., as shown in FIG. 2. An intermediate region between these regions has a gentle temperature-gradient. The processing apparatus as illustrated in FIG. 2 can be utilized for a process where the temperature-elevating speed may be low.

Figure 3:
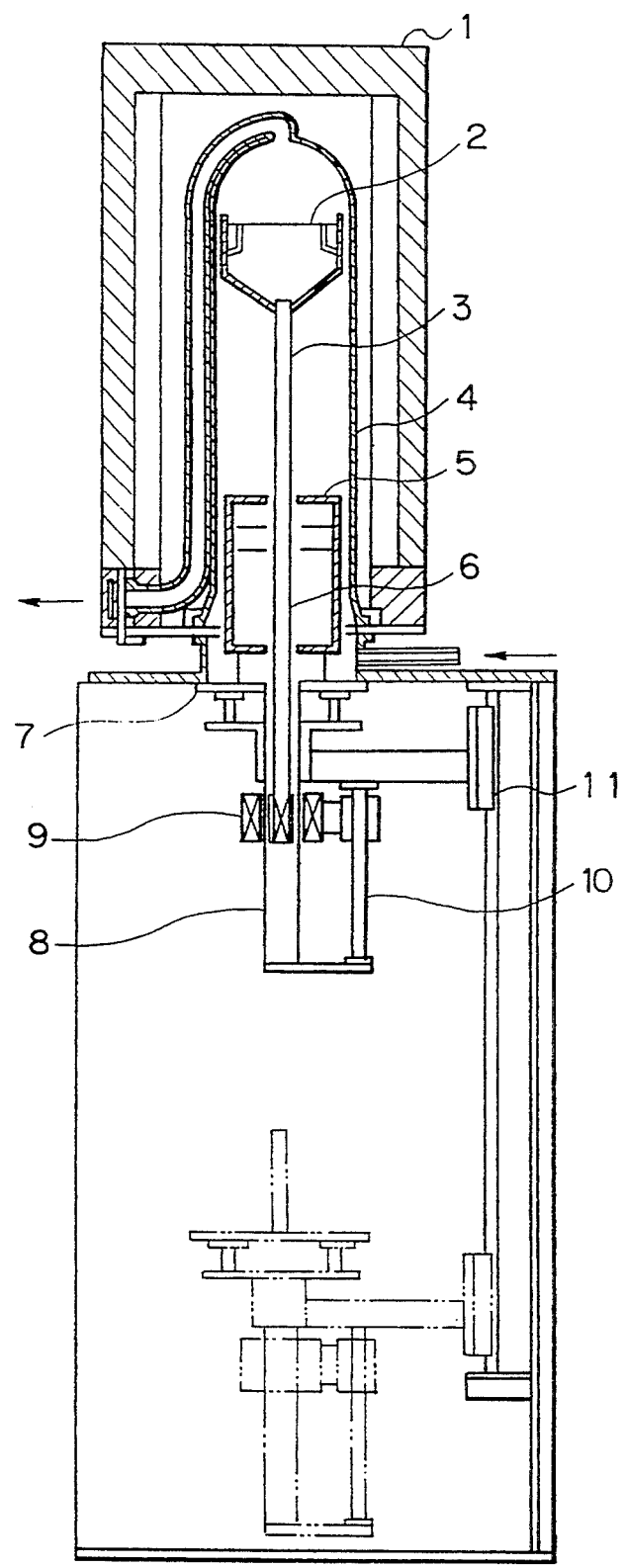
FIG. 3 illustrates a further embodiment of the first apparatus according to the present invention and temperature distribution in this apparatus.
Figure 4:
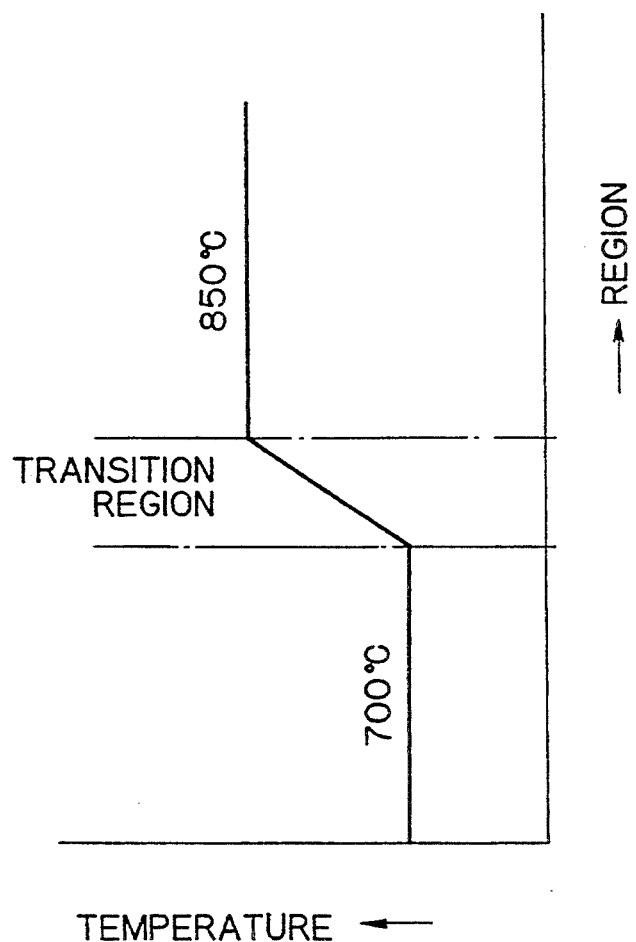
FIG. 4 illustrates a temperature gradient of the apparatus according to FIG. 3.

In FIG. 3, there is shown an example of the first apparatus according to the present invention, which is the same as that shown in FIG. 2, except that the two electric heaters (included in the reactor body 1) are separated. The lower and higher electric heaters establish temperatures of 700° C. and 850° C., respectively, as is shown in FIG. 4. An intermediate region is formed between these temperature levels. A wafer 2 is mounted on the wafer holder 3, whose heat mass is set low. The wafer 2 is positioned in a high temperature region and is annealed, while inert gas or nitrogen gas is introduced as is shown by an arrow in the right side of the drawing and is withdrawn as is shown by an arrow in the left side of the drawing.

The high temperature region may have a temperature higher than 800° C., for example 950°-1000° C. The low temperature region may have a temperature of 650°-700° C. It was found that the intermediate region became as long as 400-800 mm even in a processing apparatus, whose lower electric heater is omitted. In a processing apparatus with a lower electric heater the intermediate region becomes longer. If a plurality of wafers are heated at once, the intermediate region becomes longer than the above described value. When from ten to twenty five wafers are treated at once, their thickness amounting to from 150 to 250 mm is added to the above mentioned 100-800 mm, in each of the first and second regions, so that the total length of the processing apparatus becomes very long. As a result, the processing apparatus becomes very expensive and difficult to maintain and handle or install in a prevailing heat-treating room.

In the first and second methods and apparatuses, the body of a vertical thermal reactor at the intermediate region is conventional and consists for example of a stainless steel sheet and refractory material. The body of a vertical thermal reactor at the intermediate region in the third method and apparatus is constructed such that the heat is positively absorbed. Such a construction may be one or a combination of the following methods: (1) forced cooling of the reactor body to absorb the convention heat, radiant heat and conduction heat attributable to both high and low-temperature electric heaters; (2) lessening the heat reflecting from a high-temperature region to a low-temperature region; and (3) constructing the furnace body to a cylindrical jacket with black plated inner surface for promoting the heat absorption. The heat-insulating zone provided with the heat shielding means may be provided with a gas-inlet and a gas-outlet, below and above said zone, respectively, so as to cool the heat-insulating zone with the gas admitted into the same through the gas-inlet.

In the third method of the present invention, a wafer is moved through the intermediate region provided with the heat-shielding means for absorbing heat. Since the intermediate region is short, the third method is particularly appropriate for the rapid thermal annealing (RTP). According to a specific RTP method, a 6 inch wafer is subjected to a low-temperature heating of 500° C. or 800° C. and to a high-temperature of 750° C. or 950° C. in an upper high temperature region with a soaking length of 250 mm, the length of intermediate region being 250 mm.

In the third method and apparatus according to the present invention, a heat reflector plate is applied on the both ends of the heat-shielding means and, preferably, a heat-reflector film is applied on the heat-reflector plate. The heat-reflector plate and film reflect the heat from the electric heaters, thereby making the temperature gradient steep in the intermediate region and shortening its length. Cold is the most appropriate material for the heat-reflector film. Other metal having brightness can also be used without inconvenience.

Heat radiation becomes prevailing in the heat transfer at a temperature of 800° C. or more. Convection becomes prevailing at a temperature of 700° C. or less. When it is intended to attain heating temperature of 800° C. by the second electric heater and the desired low temperature by the first electric heater, and also attain desired temperature fall in the intermediate region as short as possible, it is necessary to effectively absorb the radiant heat. In addition, the gas convection makes the temperature gradient slow. It is therefore necessary to absorb the convection heat. The heat-shielding means is therefore provided between the first and second electric heaters.

A method for producing a semiconductor device according to the present invention is hereinafter described with reference to FIG. 3.

First, the wafer holder elevating system 11 and the magnets 9 for displacing magnets are lowered down to the lowest position as is shown by the two-dot chain line. One wafer 2 is taken out from the cassette (not shown in the drawing) for storing wafers and is placed on the wafer-holder 3. The wafer-holder elevating system 11 is then elevated to such a position that the wafer is situated in the region where the temperature is 700° C. The susceptor 7 is then abutted against the lower end of the quartz reaction tube 4 and they (7, 4) are tightly closed with respect to one another.

Growth of a thin layer is carried out at the wafer position as described above. An example of such growth is the formation of a B-PSG layer using TEOS. When a B-PSG layer is to be formed on a 6-inch wafer, a source of TEOS, TMOP or TMOB, is maintained at a temperature of from 35° to 60° C., and nitrogen carrier gas is bubbled in and passed through the source and is then introduced into the quartz reaction tube, whose inner pressure is 0.3 torr. When the source gas is brought into reaction with a wafer at 700° C., a thin layer is caused to grow on the wafer at a rate of 100Å/minute.

Subsequently, the magnets 9 for moving a wafer are driven to lift the wafer to a position as is shown in FIG. 3 where the temperature is 850° C. The wafer is then held at this temperature for 15 to 30 minutes. The magnets 9 for moving a wafer are then again driven to lower the wafer to the position where the temperature is 700° C. When the temperature of high-temperature region is 900° C., the wafer can be held in this region for 3 to 6 minutes. When the temperature of the high-temperature region is 950° C., the holding time of wafer in this region may be from 35 to 70 seconds. The total weight of wafer-holder 3 is kept so light that it can be advantageously quickly moved between the regions having temperature of 700° C. and 850° C.

The example as described above is the growth of a B-PSG layer on a wafer in the low-temperature region and annealing in the high-temperature region. Margin of the process parameters is broader for the case of heating one wafer than in a batch process, in which a plurality of the wafers are treated at once Therefore, a uniform layer can be formed on a wafer even at a temperature higher than 800° C. When $N_2O$ is added to silane or disilane, generation of particles is suppressed. When the boron concentration of the B-PSG is high, a B-PSG layer can be formed at a low temperature of from 820° to 850° C., while reflowing and flattening the B-PSG layer. The growth and reflowing of the B-PSG layer can therefore be carried out at high temperature side for a short period of time.

The top end of the quartz reaction tube 4 is closed. That is, the end of the quartz reaction tube is located at the high-temperature region. This is one of the features of the present invention. A thin layer, which is formed at high temperature, is strongly adhered on the tube wall with the result that falling of particles from the tube wall onto the wafer surface is prevented.

Figure 5:
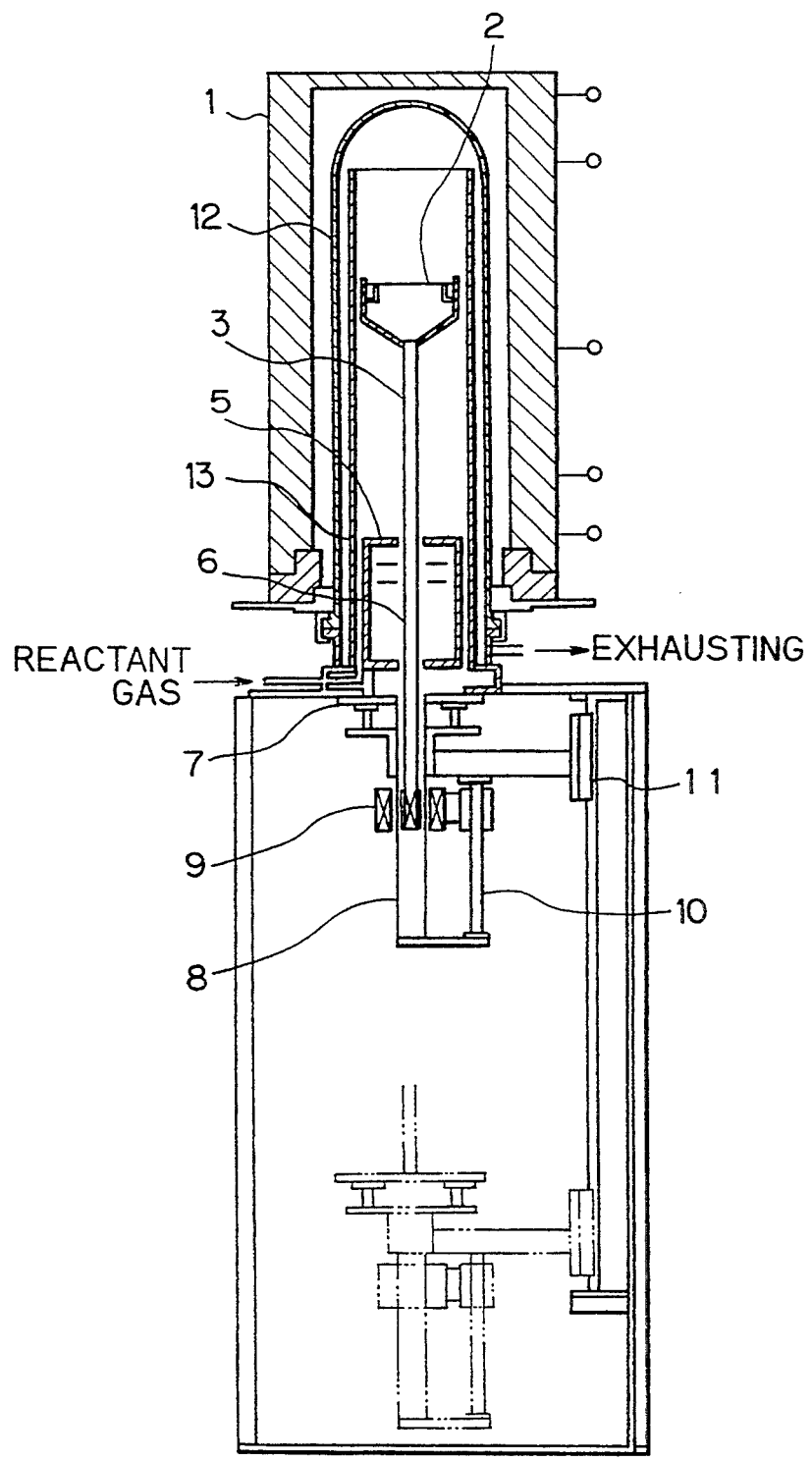
FIG. 5 illustrates an embodiment of the first apparatus according to the present invention.

FIG. 5 is cross sectional view of another example of the vertical electric furnace. The features of this furnace is a dual tube type comprising a quartz reactor outer-tube 12 and a quartz reactor inner tube 13. The top of the vertical electric furnace shown in FIG. 5 is also closed at the top of the outer-tube 12.

Figure 6:
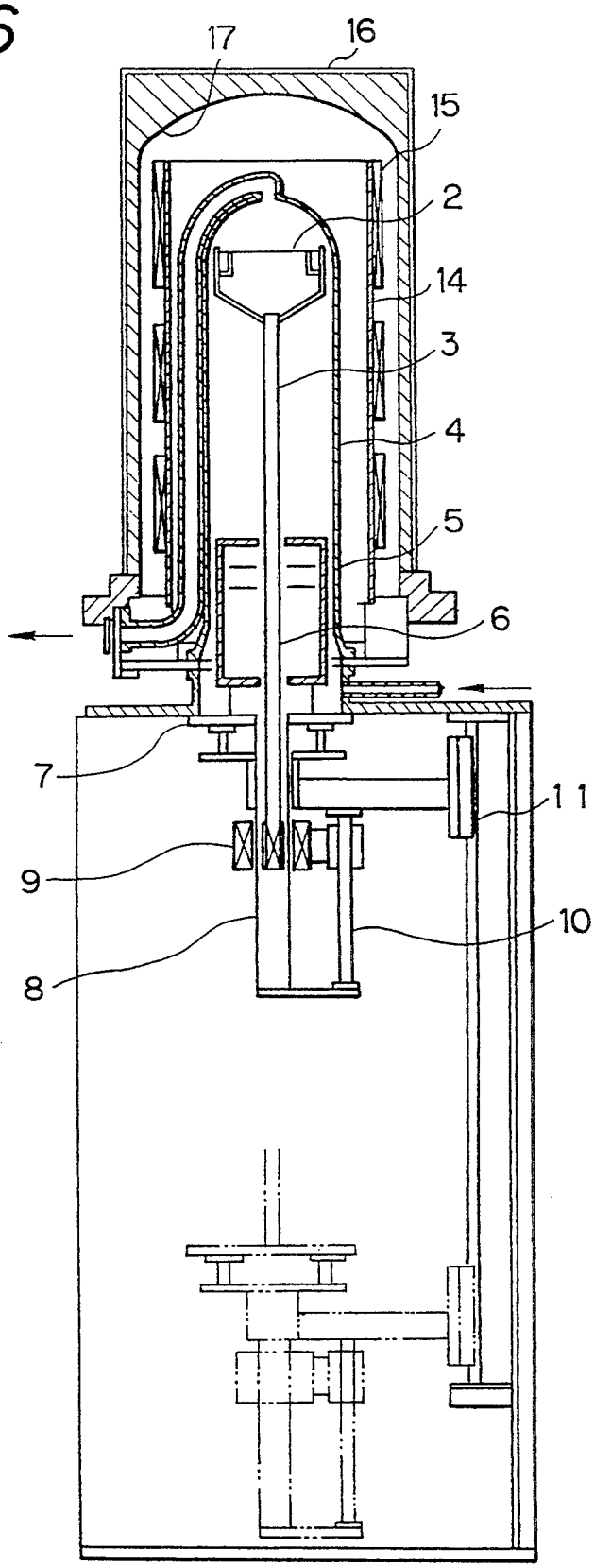
FIG. 6 also illustrates an embodiment of the first apparatus according to the present invention.

FIG. 6 is a cross sectional view of a yet another example of the vertical electric reactor, which is gold-furnace type comprising a quartz tube 14 for securing electric heaters, electric heaters 15, a water-cooled jacket 16, and a reflector 17. Heat ray is reflected from the reflector 17, so that the stepwise temperature-distribution can be easily realized. The top of the furnace is closed as well.

The temperature distribution of the vertical electric reactor illustrated in FIGS. 5 and 6 is the same as that shown in FIG. 3. The treatment in the former furnaces is the same as that in the latter furnace.

Figure 7:
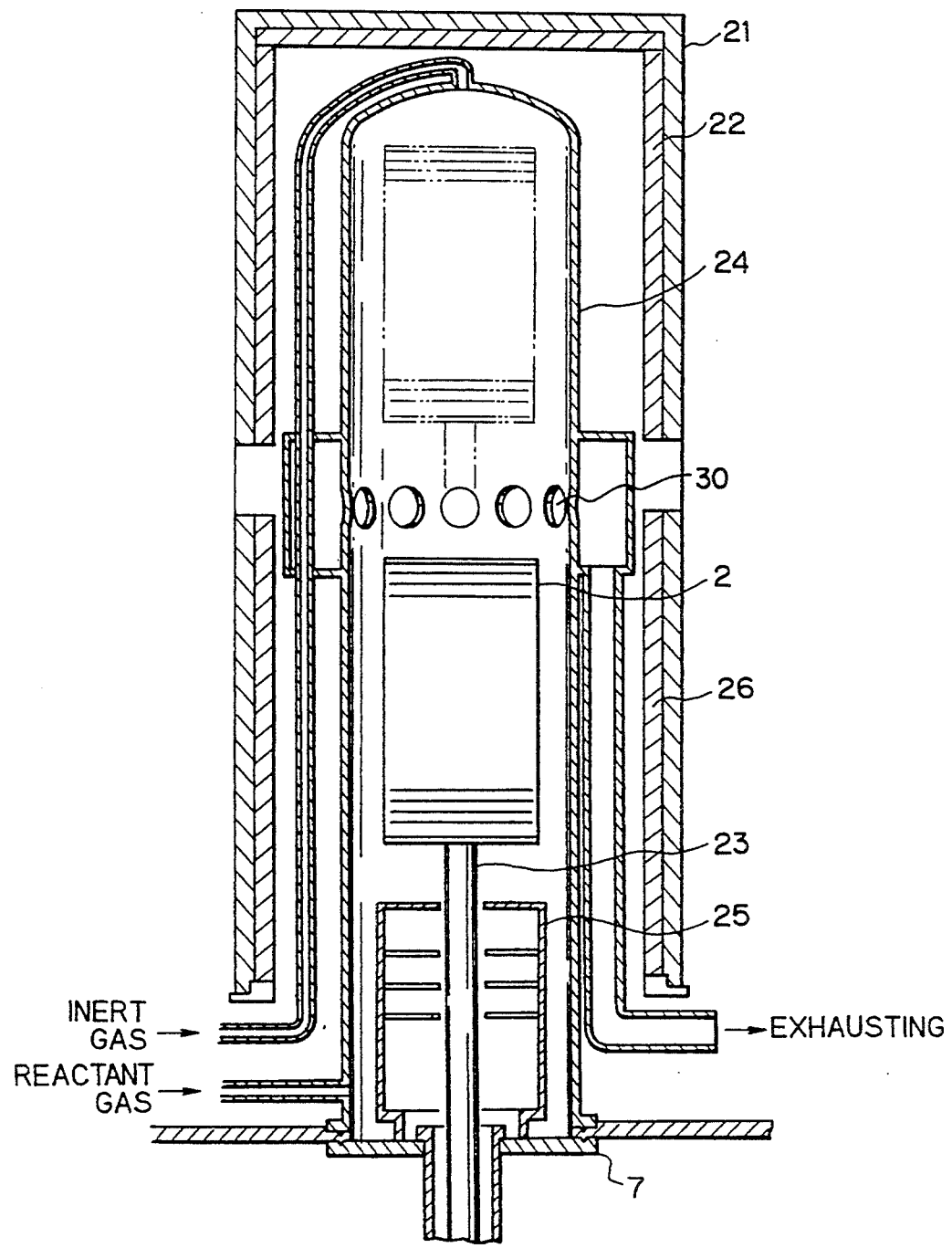
FIG. 7 illustrates an embodiment of the second apparatus according to the present invention.
Figure 8:
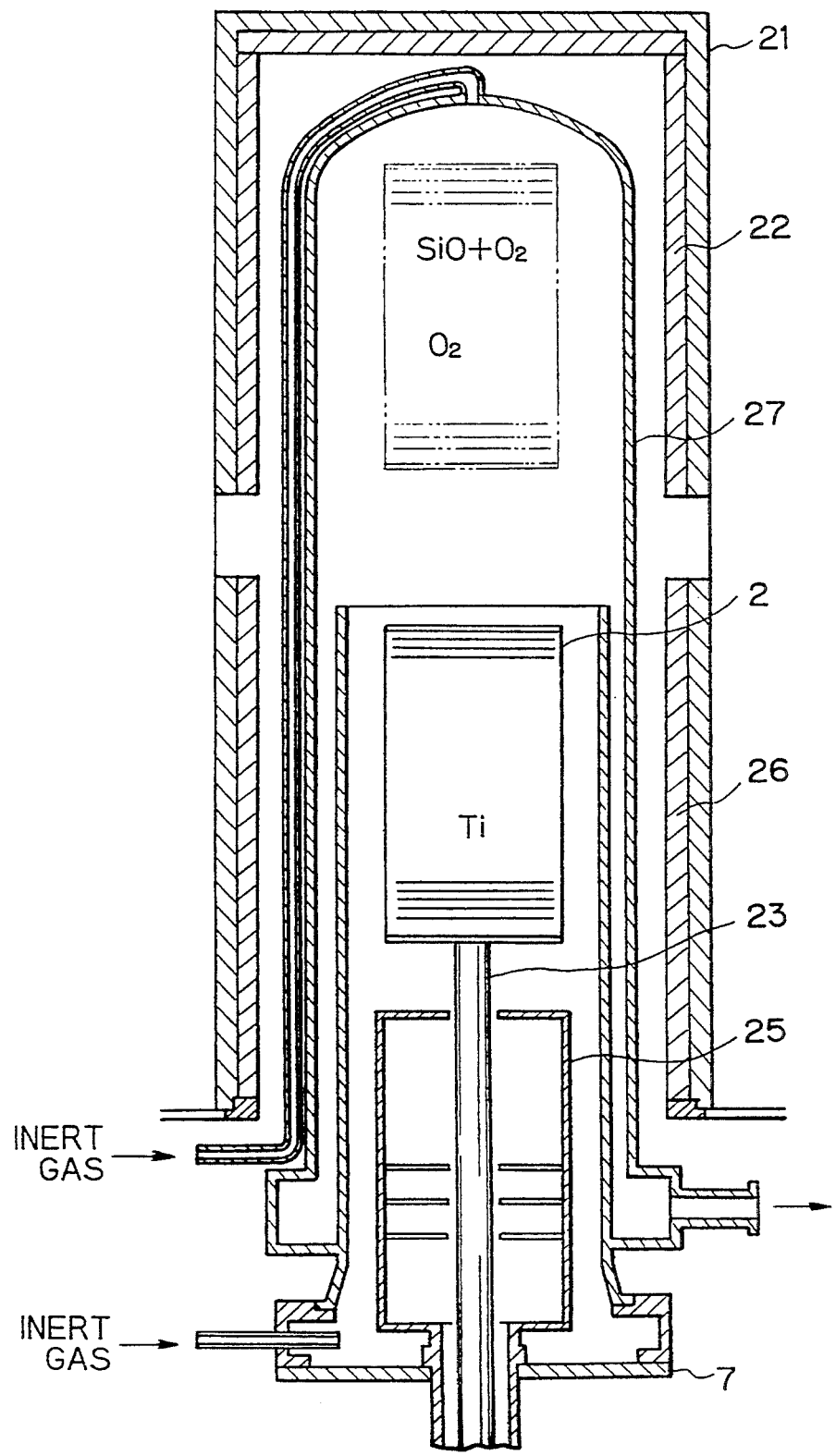
FIG. 8 illustrates an embodiment of the second apparatus according to the present invention.

FIGS. 7 and 8 illustrate the second apparatus and a method for preventing the particles falling down and depositing on a wafer. The members of the electric furnace are denoted as follows: a reactor body including heaters—21; upper electric heater—22; a wafer-holder—23; a quartz reactor-body—24; a quartz heat insulting tube—25; lower electric heater—26; and, a quartz reaction tube—27.

The vertical thermal reactor having the structure of an electric furnace shown in FIG. 7 is a single-tube type having the following features. A space is formed between the lower electric heater 26 setting low temperature and the upper electric heater 22 setting high temperature to adjust the distance between the heaters 22, 26. The intermediate region corresponds to this space. Approximately twenty five wafers can be located in the inner space of the quartz reactor-body surrounded by each of the upper and lower electric heaters 22 and 26. A number of gas-exhausting holes 30 are provided as shown in the drawing in the intermediate region. Two gas inlets are provided as is shown in the drawing. The upper gas-inlet is used for introducing inert gas, while the lower gas-inlet is used for introducing reactant gas.

The vertical thermal reactor utilizes a short inner tube located coaxially with respect to the quartz reaction tube 27 and ending at almost a half of this tube 27. Gas can be withdrawn from this vertical thermal reactor at the top of the short inner tube and through the ring-form clearance between the two tubes. Gas can therefore be withdrawn from the intermediate region formed between the higher and lower electric heaters, as in the case of the reactor shown in FIG. 7.

The vertical thermal reactors shown in FIGS. 7 and 8 can be used as follows.

CVD

Growth of PSG is carried out as follows. Wafers 2 are preliminarily set in a lower part of the vertical thermal reactors and is heated by the lower electric heater 26 to 680°–750° C. TEOS and TMOP are kept in the sources at 60° C. and are flown through the lower gas inlet at flow rate of for example, 2000 cc/min in terms of overthrough for each of TEOS and TMOP. Inert gas, for example nitrogen gas, is flown through the upper gas-inlet at flow rate of for example 2000 cc/min.

Growth of B-PSG can be carried out by the above method, in which another reactant gas, i.e., TMB, is flown through the lower gas-inlet.

Wafers, on which PSG or B-PSG is grown as described above, are immediately moved to the position of the upper electric heater 22 and are subjected to reflowing. Reflowing temperature of PSG is for example 1050° C.

Diffusion from Glass Layer

In order to deposit a layer containing impurities on the wafers, POCl$_3$ and O$_2$ are flown while the wafers are located at the position of the lower electric heater 26, the setting temperature of which may be 700°–800° C. After the deposition, the wafers are moved to the position of the upper electric heater 22 and are then subjected to drive-in at temperature of 900°–1100° C.

Diffusion from Deped Polysilicon

Wafers are located at the position of the lower electric heater 26, and polysilicon, in which one or more of phosphorous, boron, arsenic and antimony are doped, is deposited by a conventional growth method on the wafers. A reactant gas for the growth of polysilicon may be Si$_2$H$_6$. In this case, the growth temperature set by the lower electric heater 26 may be 500° C. A reactant gas for the growth of polysilicon may be SiH$_4$. In this case, the growth temperature set by the lower electric heater 26 may be 610° C. After the growth, the wafers 2 are moved to the position of upper electric heater 22 and are subjected to the diffusion process of impurities at 900°≧1100° C.

Figure 9:
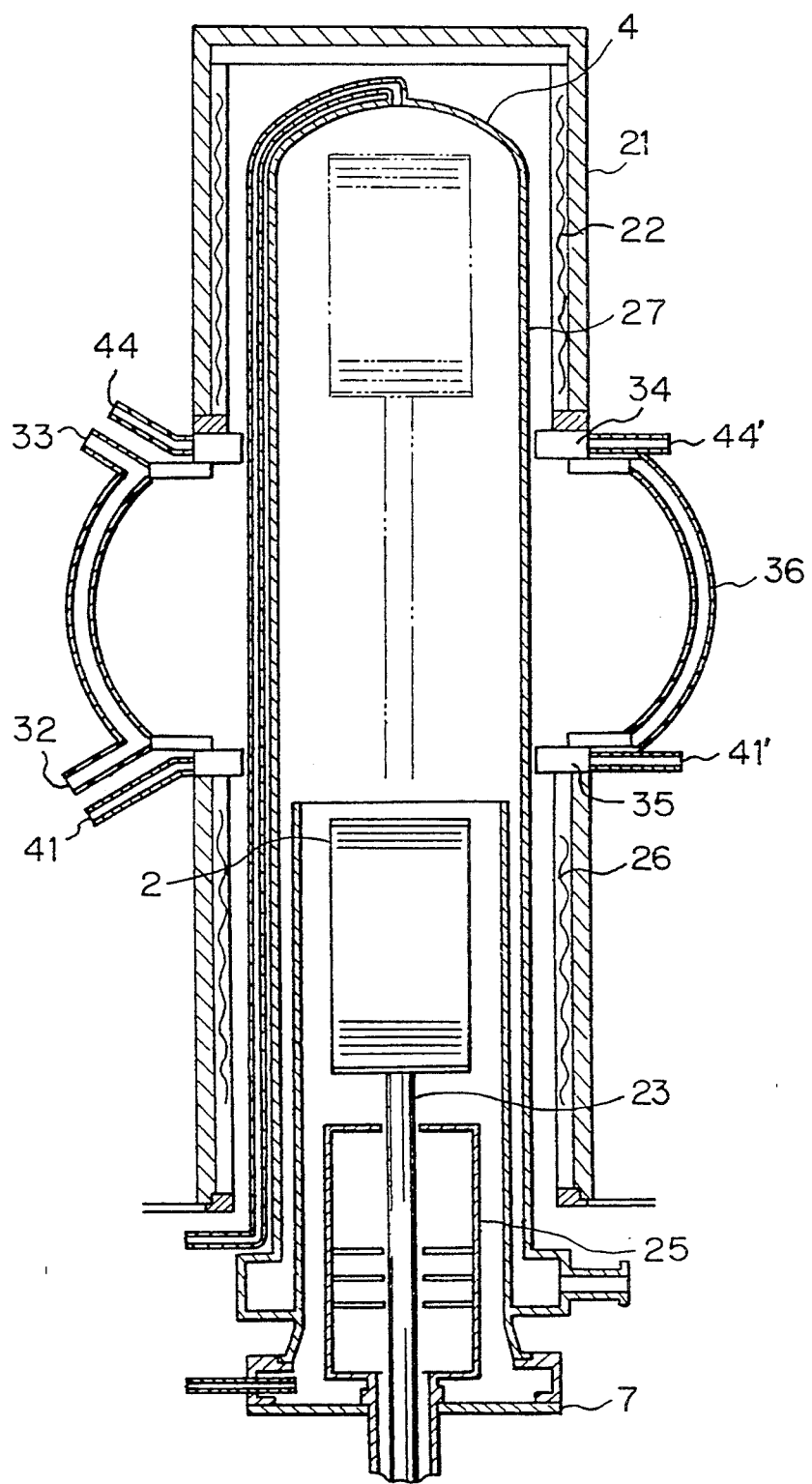
FIG. 9 illustrates an embodiment of the third apparatus according to the present invention.

Referring to FIG. 9, an example of the vertical thermal reactor according to the present invention is illustrated.

The elements 2, 7, 21–27 of the vertical thermal reactor denote the same elements as in FIG. 8. The heat-shielding means 36 has a cavity in the interior thereof to flow the cooling media, such as cooling water, compressed air, liquified gas or brine. The introduction conduit 32 and exhausting conduit 33 of the cooling media are attached to the heat-shielding means 36. The heat-shielding means 36 has a dual structure of stainless steel sheets which are bent to form therebetween a jacket for flowing the cooing media therethrough. Black plating may be applied on the inner surface of the heat-shielding means 6. In order to enhance the absorbing efficiently, the surface of the heat-shielding means 6 is increased.

Radiant heat from the electric heater of the second region (the high-temperature region) passes across the reactor core and is then effectively absorbed by a portion of the heat-shielding means 36 located at the opposite side from the electric heater as seen from the reactor axis. Likewise, the conventional heat is effectively absorbed by the heat-shielding means 36. Cooling water in the heat-shielding means is heated but is fed without interruption into the jacket so as to the avoid the boiling of cooling water and to maintain effective heat-absorption. Although the cross sectional shape of the heat-shielding means 6 is semi-circular in the drawing, the shape is not limited to this one but the Japanese Katakana shape can realize the same effects.

Copper plates are assembled to form reflecting rings 34, 35, which have also jacket in the interior for flowing cooling water or the like. The conduits 41, 44 for introducing cooling water and outlets 41', 44' are attached to the reflecting rings 34, 35. An Au plating is applied on the copper sheets so as to enhance the reflecting ratio of convention heat.

Radiant heat from the upper electrical heater is therefore reflected by the reflecting rings 34, 35 and is reverted into the second region (high-temperature region) of the vertical thermal reactor. Desirably, the reflecting rings 34, 35 should be protruded into the reactor interior as long as possible the structure of a vertical reactor permits.

Length of the apparatus shown in FIG. 9 can be as short as 3 m or less.

I claim:

1. An apparatus for manufacturing semiconductor devices for processing one or more semiconductor wafers therein comprising:
   a reactor body having an inner space and having a cylindrical outer surface portion, said outer portion extending vertically, said reactor body having an open bottom end portion;
   a first electric heating means for establishing a first region of the vertical thermal reactor, said first region extending over a predetermined distance;
   a second electric heating means for establishing a second region of the vertical thermal reactor, second region situated above the first region, extending over a predetermined distance and having a second temperature higher than the first temperature;
   means for moving the wafer or wafers from the first to second regions and then from the second to first regions and holding the wafer or wafers in these regions for processing; and,
   a gas-inlet for introducing reaction gas or inert into said inner space of the body.

2. An apparatus according to claim 1, wherein the reactor body has a closed top portion and an opening placed at said closed top portion.

3. An apparatus according to claim 2, further comprising a conduit connecting said opening and placed along with said outer surface of the reactor body.

4. An apparatus according to claim 1, further comprising a water-cooled jacket positioned substantially coaxially with respect to said reactor body.

5. An apparatus according to claim 1, wherein said reactor body has an opening at a bottom part of the cylindrical outer surface portion.

6. An apparatus according to claim 1 having a dual-tube structure consisting of said reactor body which has a closed top end, and an inner tube, which is a cylindrical body having an open top end and is positioned essentially coaxially with respect to the reactor body.

7. An apparatus according to claim 1, wherein said inner tube has an opening at a bottom part of the cylindrical outer surface portion, and said reactor body has an opening at a bottom part of the cylindrical body.

8. An apparatus for manufacturing semiconductor devices for processing one or more semiconductor wafers therein comprising:
   a reactor body having an inner space and having a cylindrical outer surface portion, said outer portion extending vertically, said reactor body having an open bottom end portion;
   a first electric heating means for establishing a first region of the vertical thermal reactor, said first region extending over a predetermined distance;
   a second electric heating means for establishing a second region of the vertical thermal reactor, said second region situated above the first region, extending over a predetermined distance and having a second temperature higher than the first temperature;
   an intermediate region between the first and second regions, for separating the first and second electrical heating means from one another, which region having an adjustable length;

a port for withdrawing gas in the reactor body, formed through the body in the intermediate region or in the vicinity of at least one of the first and second regions;

a means for moving the wafer or wafers from the first to second regions and then from the second to first regions and holding the wafer or wafers in these regions for processing; and, a gas-inlet for introducing reaction gas into said inner space of the body.

9. An apparatus according to claim 8, wherein the reactor body has a closed top portion and an opening placed at said closed top portion.

10. An apparatus according to claim 9, further comprising a conduit connecting said opening and placed along with said outlet surface of the reactor body.

11. An apparatus according to claim 8, further comprising a water-cooled jacket positioned substantially coaxially with respect to said reactor body.

12. An apparatus according to claim 8, wherein said reactor body has an opening at a bottom part of the cylindrical outer surface portion.

13. An apparatus for manufacturing semiconductor devices for processing one or more semiconductor wafers therein comprising:

a vertical reactor body having an inner space and having a cylindrical outer surface portion, said outer portion extending vertically, said reactor body having an open bottom end portion and closed top portion;

a first electric heating means for establishing a first region of the vertical thermal reactor, said first region extending over a predetermined distance;

a second electric heating means for establishing a second region of the vertical thermal reactor, said second region situated above the first region, extending over a predetermined distance and having a second temperature higher than the first temperature;

a means for moving the wafer or wafers from the first to second regions and then from the second to first regions and holding the wafer or wafers in these regions for processing; and, an intermediate region of the vertical reactor body between the first and second regions, provided with a means for shielding and absorbing heat from both first and second electric heating means.

14. An apparatus according to claim 13, wherein the reactor body has a closed top portion and an opening placed at said closed top portion.

15. An apparatus according to claim 13, further comprising a conduit connecting said opening and placed along with said outer surface of the reactor body.

16. An apparatus according to claim 13, further comprising a water-cooled jacket positioned substantially coaxially with respect to said reactor body.

17. An apparatus according to claim 13, wherein said reactor body has an opening at a bottom part of the cylindrical outer surface portion.

18. An apparatus according to claim 13, wherein said second electric heating means set a temperature of 700° C. or more.

19. An apparatus according to claim 13, wherein said heat-shielding and absorbing means is a cavity formed in the intermediate region and cooling media flowing through the cavity.

20. An apparatus according to claim 13, wherein black plating is applied on the inner surface of said heat-shielding and absorbing means.

21. An apparatus according to claim 19, wherein said intermediate region has a semicircular cross section.

22. An apparatus according to claim 18, 19, 20, or 21, wherein a heat reflector is provided on the both ends surfaces of the heat-shielding and absorbing means.

* * * * *